US010377265B2

(12) United States Patent
Wytock et al.

(10) Patent No.: US 10,377,265 B2
(45) Date of Patent: Aug. 13, 2019

(54) MEDIATOR DEVICE FOR SMART ELECTRIC VEHICLE CHARGING

(71) Applicant: Google LLC, Mountain View, CA (US)

(72) Inventors: Matthew D. Wytock, San Jose, CA (US); Kurt Adelberger, San Mateo, CA (US); Wolf-Dietrich Weber, San Jose, CA (US); Olga Irzak, Mountain View, CA (US)

(73) Assignee: Google LLC, Mountain View, CA (US)

( * ) Notice: Subject to any disclaimer, the term of this patent is extended or adjusted under 35 U.S.C. 154(b) by 301 days.

(21) Appl. No.: 14/928,170

(22) Filed: Oct. 30, 2015

(65) Prior Publication Data

US 2016/0121748 A1 May 5, 2016

Related U.S. Application Data

(60) Provisional application No. 62/072,864, filed on Oct. 30, 2014.

(51) Int. Cl.
*B60L 53/64* (2019.01)
*B60L 53/30* (2019.01)
(Continued)

(52) U.S. Cl.
CPC .............. *B60L 53/30* (2019.02); *B60L 53/14* (2019.02); *B60L 53/18* (2019.02); *B60L 53/60* (2019.02);
(Continued)

(58) Field of Classification Search
CPC .................................................. B60L 11/1848
(Continued)

(56) References Cited

U.S. PATENT DOCUMENTS 8,509,976 B2 * 8/2013 Kempton ............ B60L 11/1824
320/101
8,829,852 B2 * 9/2014 Baek ........................ H02J 7/00
320/109
(Continued)

FOREIGN PATENT DOCUMENTS

CN        102750591 A     10/2012
CN        103493283 A     1/2014
(Continued)

OTHER PUBLICATIONS

International Preliminary Report on Patentability issue din International Application No. PCT/US2015/057969, dated May 11, 2017, 8 pages.

(Continued)

*Primary Examiner* — Jerry D Robbins
(74) *Attorney, Agent, or Firm* — Fish & Richardson P.C.

(57) ABSTRACT

Methods, systems, and apparatus, including computer programs encoded on a computer storage medium, for smart electric vehicle charging and a mediator device for the same. In one aspect, a method includes receiving a signal, at a first connector, indicative of a charging capacity of a charging station, from the charging station, and providing a signal indicative of a second charging capacity at a second connector to an electrical vehicle, wherein the second charging capacity is determined based on optimization data received from an optimization service.

14 Claims, 3 Drawing Sheets

(51) Int. Cl.
*G06F 1/26* (2006.01)
*G06F 17/50* (2006.01)
*H02J 7/02* (2016.01)
*H02J 13/00* (2006.01)
*H02J 7/00* (2006.01)
*B60L 53/14* (2019.01)
*B60L 53/60* (2019.01)
*B60L 53/63* (2019.01)
*B60L 53/66* (2019.01)
*B60L 58/12* (2019.01)
*B60L 53/18* (2019.01)
*B60L 53/68* (2019.01)

(52) U.S. Cl.
CPC ............. *B60L 53/63* (2019.02); *B60L 53/665* (2019.02); *B60L 53/68* (2019.02); *B60L 58/12* (2019.02); *G06F 1/26* (2013.01); *G06F 17/50* (2013.01); *H02J 7/0027* (2013.01); *H02J 7/02* (2013.01); *H02J 13/00* (2013.01); *B60L 2240/70* (2013.01); *H02J 2007/0096* (2013.01); *Y02E 60/721* (2013.01); *Y02T 10/7005* (2013.01); *Y02T 10/7055* (2013.01); *Y02T 10/7088* (2013.01); *Y02T 10/7291* (2013.01); *Y02T 90/121* (2013.01); *Y02T 90/128* (2013.01); *Y02T 90/14* (2013.01); *Y02T 90/16* (2013.01); *Y02T 90/163* (2013.01); *Y02T 90/168* (2013.01); *Y04S 10/126* (2013.01); *Y04S 30/12* (2013.01)

(58) Field of Classification Search
USPC ......................................................... 320/109
See application file for complete search history.

(56) References Cited

U.S. PATENT DOCUMENTS

| | | | | |
|---|---|---|---|---|
| 9,779,365 | B2* | 10/2017 | Smullin | G06Q 10/02 |
| 2008/0039979 | A1* | 2/2008 | Bridges | B60L 11/1816 |
| | | | | 700/292 |
| 2009/0088907 | A1* | 4/2009 | Lewis | G01D 4/002 |
| | | | | 700/286 |
| 2009/0229900 | A1* | 9/2009 | Hafner | B60L 3/0046 |
| | | | | 180/65.275 |
| 2009/0259603 | A1* | 10/2009 | Housh | B60L 11/1818 |
| | | | | 705/412 |
| 2011/0291616 | A1* | 12/2011 | Kim | B60L 3/003 |
| | | | | 320/109 |
| 2012/0249065 | A1 | 10/2012 | Bissonette et al. | |
| 2013/0057211 | A1 | 3/2013 | Kuribayashi et al. | |
| 2014/0062401 | A1 | 3/2014 | Gadh et al. | |

FOREIGN PATENT DOCUMENTS

| | | |
|---|---|---|
| EP | 2505421 | 10/2012 |
| EP | 2685586 | 1/2014 |
| WO | 2013/138781 | 9/2013 |

OTHER PUBLICATIONS

'SAE J1772,' [online][Retrieved on Aug. 11, 2014]; Retrieved from the Internet URL: http://en.wikipedia.org/w/index.php?title=SAE_J1772&oldid=618225623; 10 pages.
International Search Report and Written Opinion in International Application No. PCT/US2015/057969, dated Feb. 25, 2016, 12 pages.
CN Office Action issued in Chinese Application No. 201580033710.7, dated Dec. 5, 2018, 22 pages (with English translation).

* cited by examiner

MEDIATOR DEVICE FOR SMART ELECTRIC VEHICLE CHARGING

CROSS-REFERENCE TO RELATED APPLICATIONS

This application claims priority under 35 USC § 119(e) to U.S. Patent Application Ser. No. 62/072,864, filed on Oct. 30, 2014, the entire contents of which are hereby incorporated by reference.

BACKGROUND

Electrical vehicle charging stations or Electrical Vehicle Supply Equipment (EVSE) are used to supply electric vehicles (EVs) with electrical energy. Modern EVSEs are equipped with technology that allows them to communicate with electric vehicles to control the charging rate. This capability allows the charging station to communicate the amount of charging capacity available to the EV. The EV, in turns, selects a charging capacity based on the available charging capacity. The selection is typically based on the criterion to charge the EV battery as fast as possible.

However, in many cases it is not necessary for the EV to charge the battery at the full rate. For example, EV drivers may drive their car to work and leave it plugged in all day, even though charging completes in only a few hours. Similarly, when drivers arrive home at night they often leave vehicles plugged in overnight, as the car is required to be charged by the next morning.

SUMMARY

This specification describes technologies relating to electrical vehicle charging stations, and in particular a mediator device that can be interposed between the electrical vehicle and the charging station.

In general, one innovative aspect of the subject matter described in this specification can be embodied in an apparatus that is configured for connection between an electrical vehicle and an electrical vehicle charging station, comprising: a first electrical connector configured to be in electrical connection with an electrical vehicle charging station; a second electrical connector configured to be in electrical connection with an electrical vehicle; a communication system configured to be in communication with an optimization service, wherein the optimization service provides optimization data for charging the electrical vehicles from the charging station; a data processing system that performs operations comprising: receiving optimization data from the optimization service, the optimization data specifying a mediated charging capacity to be serviced by the charging station; and receiving a first signal, from the first electrical connector and provided by the charging station, indicative of a first charging capacity of the charging station, and provide a second signal indicative of a second charging capacity that is less than the first capacity to the second electrical connector to the electrical vehicle, wherein the second charging capacity is determined based on the mediated charging capacity. Other embodiments of this aspect include corresponding systems, apparatus, and computer programs, configured to perform the actions of the methods, encoded on computer storage devices.

In general, another aspect of the subject matter described in this specification can be embodied in methods that include the actions of receiving optimization data from an optimization service for the charging station, wherein the optimization data specifies a mediated charging capacity to be serviced by the charging station; receiving, from the charging station, a first signal indicative of a first charging capacity of the charging station; determining a second charging capacity for the charging station based on the received optimization data from the optimization service, wherein the second charging capacity is less than the first charging capacity and is based on the mediated charging capacity; and providing a signal indicative of the second charging capacity to the electrical vehicle. Other embodiments of this aspect include corresponding systems, apparatus, and computer programs, configured to perform the actions of the methods, encoded on computer storage devices.

Another innovative aspect of the subject matter described in this specification can be embodied in an apparatus that includes a first electrical connector configured to be in electrical connection with an electrical vehicle; a communication system configured to be in communication with an optimization service, wherein the optimization service provides optimization data for charging the electrical vehicles from the charging station; a data processing system that performs operations comprising: receiving optimization data from the optimization service, the optimization data specifying a mediated charging capacity to be serviced by the charging station; and receiving a first signal, from the charging station, indicative of a first charging capacity of the charging station, and provide a second signal indicative of a second charging capacity that is no more than the first capacity to the first electrical connector to the electrical vehicle, wherein the second charging capacity is determined based on the mediated charging capacity.

Particular embodiments of the subject matter described in this specification can be implemented so as to realize one or more of the following advantages. The use of the mediator device improves electrical vehicle charging stations efficiency by managing the charging of the electrical vehicle according to an optimized charging capacity that is based on an overall demand of a power grid, and the demands of a building electrical system and pricing systems. The mediator device allows for integration of vehicles into the grid. The use of the mediator device decreases the cost associated with charging vehicles, for example, via peak shaving. The mediator device provides access to optimization services for deployed charging stations that do not otherwise have access to optimization service. Charging stations and electrical vehicles thus do not need to be redesigned to receive the optimization data, and thus there is little to no impact on existing infrastructure. This eliminates costs associated with modification of deployed charging stations. Furthermore, the mediator device may conform to existing charging standards so that it may be used with minimal user setup or configuration.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The subject matter below relates to electrical vehicles (EV) and electrical vehicle supply equipment (EVSE) or electrical vehicle charging stations. The electrical vehicle charging stations provide electrical energy to electric cars. The charging rate of each electrical vehicle is determined by the electrical vehicle based on the charging station's capacity and based on the current electrical vehicle charge. However, many of the electrical vehicle charging stations and EVSEs that are currently deployed are not capable of optimizing their charging rates based on factors other than the capacity and vehicle being charged as described above. Such other factors may take into account grid demands, usage times of the particular vehicles, etc.

As described below, a mediator device is interposed between electrical vehicles and charging stations, or EVSEs. The mediator device is capable of communicating with an optimization service that includes optimization data, such as cost data, time data, and prediction data. The mediator device can also control the charging rates of the electrical energy supplied from EVSEs to respective electrical vehicles, based on the optimization data received. For example, if an electrical vehicle is predicted to be connected to an EVSE for eight hours and the cost of electrical energy is cheaper in the last four hours of the eight hour period, the mediator device may cause the EVSE to charge the electrical vehicle at a low rate for the first four hours (or not charge the electrical vehicle at all for the first four hours) and at a higher rate for the last four hours. In turn, this would reduce the cost incurred by the owner of the electrical vehicle. Other optimization factors may also be used.

The mediator device is a device that does not require alteration of already deployed EVSEs or EVs. The mediator device controls the charging rate of a vehicle by modifying the charge capacity value output by the EVSE. For example, if an EVSE states it may provide up to 8 kW of power, an EV may begin drawing 8 kW of power for charging. However, the mediator device may receive data describing that the optimum charging rate may be 4 kW, and thus may modify the signal provided by the EVSE to the EV so that the EV may only draw up to 4 kW of power for charging. This allows currently deployed EVSEs to perform more efficiently without incurring the expensive costs associated with replacing the deployed EVSEs.

These features and additional features are described in more detail below.

Figure 1A:
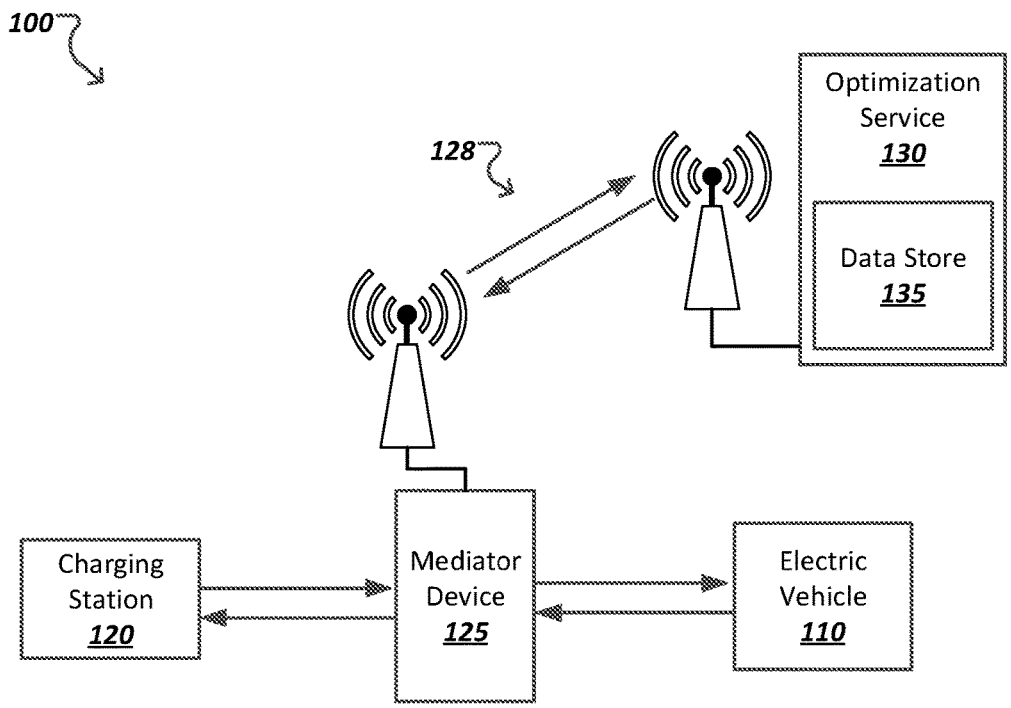
FIG. 1A is a block diagram of an example environment in which a mediator device controls charging of an electrical vehicle.

FIG. 1A is a block diagram of an example environment 100 in which a mediator device 125 for electrical vehicle charging controls charging of an electrical vehicle 110. The charging station 120 is an electrical vehicle charging station that is responsible for supplying electrical vehicles with electrical energy from an electrical grid. The mediator device 125 is interposed between the connectors of the charging station 120 and electrical vehicle 110. The mediator device 125 is in bi-directional communication with charging station 120 and electrical vehicle 110. In some implementations, the mediator device 125 is connected to the electrical vehicle 110 and the charging station 120 by an electrical connectors conforming to the SAEJ1772 standard. Connectors conforming to other standards may also be used.

The mediator device 125 is shown to be in wireless communication 128 with an optimization service 130. For example, a wireless communication device that wirelessly communicates with a similar wireless device at the optimization service may be integrated into the mediator device 125. In different implementations, the mediator device 125 may communicated with the optimization service 130 by a wired connection and over one or more networks.

The optimization service 130 also includes a data store 135. In some implementations, optimization service 130 collects data associated with electrical vehicle charging. For example, in some implementations, the optimization service 130 collects and stores the cost-demand curve for supplying electrical energy from the grid. In some implementations, data indicative of pricing at different times of the day for electrical energy supplied may also be collected and stored. In some implementations, the optimization service also includes information related to particular vehicles. For example, the optimization service may collect and store information indicative that a particular vehicle is connected to a particular charging station every night between 10:00 pm and 8:00 am.

The data store 135 may also store data specific to each charging station 120. Such data may include local grids to which the station 120 is connected, the maximum charging capacity provided by the charging station, and other data that may be useful in making determinations for optimized charging capacities.

In some implementations, the optimization service performs predictions regarding attributes similar to the attributes described above. For example, the optimization service may predict that a particular car is going to be connected to a particular charging station between 10:00 pm and 8:00 am based on stored historical information. Similarly, the optimization service may predict pricing of electrical energy is likely to be lower between the hours of 2:00 am and 5:00 am based on historical information and data recorded. In some implementations, predictions may be performed periodically and stored in data store 135. In some implementations, the predictions are performed on the fly as needed.

The connection between the mediator device 125 and the optimization service 130 allows the mediator device 125 to receive optimization data from the optimization service 130. For example, the optimization data may specify a mediated charging capacity to be serviced by the charging station 120. The mediated charging capacity may be equal to or less than the actual charging capacity available from the charging station 120. For example, depending on the optimization, the mediated charging capacity may be 0; or may be a portion of the actual charging capacity, e.g., 50%. For situations in which a discrete set of charging capacities are available, e.g. 0 kW, 1 kW, 2 kW, etc., the mediated charging capacity may be any one of the discrete charging capacities that does not exceed the actual charging capacity.

In operation, a charging station 120 provides a signal that specifies its available charging capacity to an electric vehicle 110. The electric vehicle, in turn, selects a charging capacity that is equal to or less than the available charging capacity provided by the charging station, and then begins to charge at the selected charging capacity. Thus, by modifying the signal that specifies the available charging capacity, the mediator device 125 is capable of controlling the charging of the electrical vehicle 110 by the charging station 120.

Figure 1B:
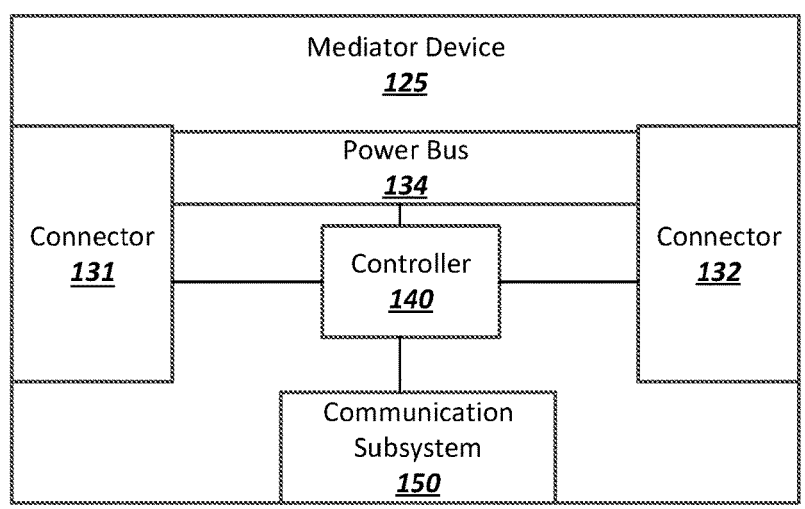
FIG. 1B is a block diagram of a mediator device.

FIG. 1B is a block diagram of a mediator device 125. The mediator device 125 includes a first electrical connector 131, a second electrical connector 132, a power bus 134, a controller 140, and a communication subsystem 150. The first electrical connector 131 is configured to be in electrical connection with the electrical vehicle charging station 120, and the second electrical connector 132 is configured to be in electrical connection with electrical vehicle 110. A power bus 134 may include one or more conductors connecting the connectors 131 and 132.

The communication system 150 configured to be in communication with the optimization service 130. The communication system 150 can be a wireless communication system or a wired communication system.

The controller 140 is a data processing system that performs operations to control the rate at which the electrical vehicle 110 will charge. In operation, the controller 140 receives optimization data from the optimization service by means of the communication subsystem 150. The optimization data specifies a mediated charging capacity to be serviced by the charging station.

The controller 140 also receives a first signal, from the first electrical connector 131 and provided by the charging station 120, that is indicative of a first charging capacity of the charging station 120. The controller 140, in turn, provides a second signal indicative of a second charging capacity that is less than or equal to the first capacity to the second electrical connector 132, and thus to the electrical vehicle 110.

The second charging capacity is determined based on the mediated charging capacity. In some implementations, the controller 140 may receive the first charging capacity from the charging station 120 and provide the data indicating the first charging capacity to the optimization service 130. The optimization service 130 will return data describing the mediated charging capacity, which is less than or equal to the first charging capacity.

In other implementations, the controller 140 does not provide the data indicating the first charging capacity to the optimization service 130. Instead, the controller receives the from the optimization service 130 the mediated charging capacity, and selects the lesser of the two charging capacities respectively specified by the charging station 120 and the optimization service 130. For example, should the mediated charging capacity be more than the first charging capacity, the controller 140 will select the first charging capacity and provide data indicating the first charging capacity to the electric vehicle 110. The controller 140 may optionally report to the optimization service 130 that the service 130 is specifying a charging capacity that is not supported by the charging station 120 so that the optimization service may incorporate this data in future requests for optimization data for that charging station 120.

Figure 2:
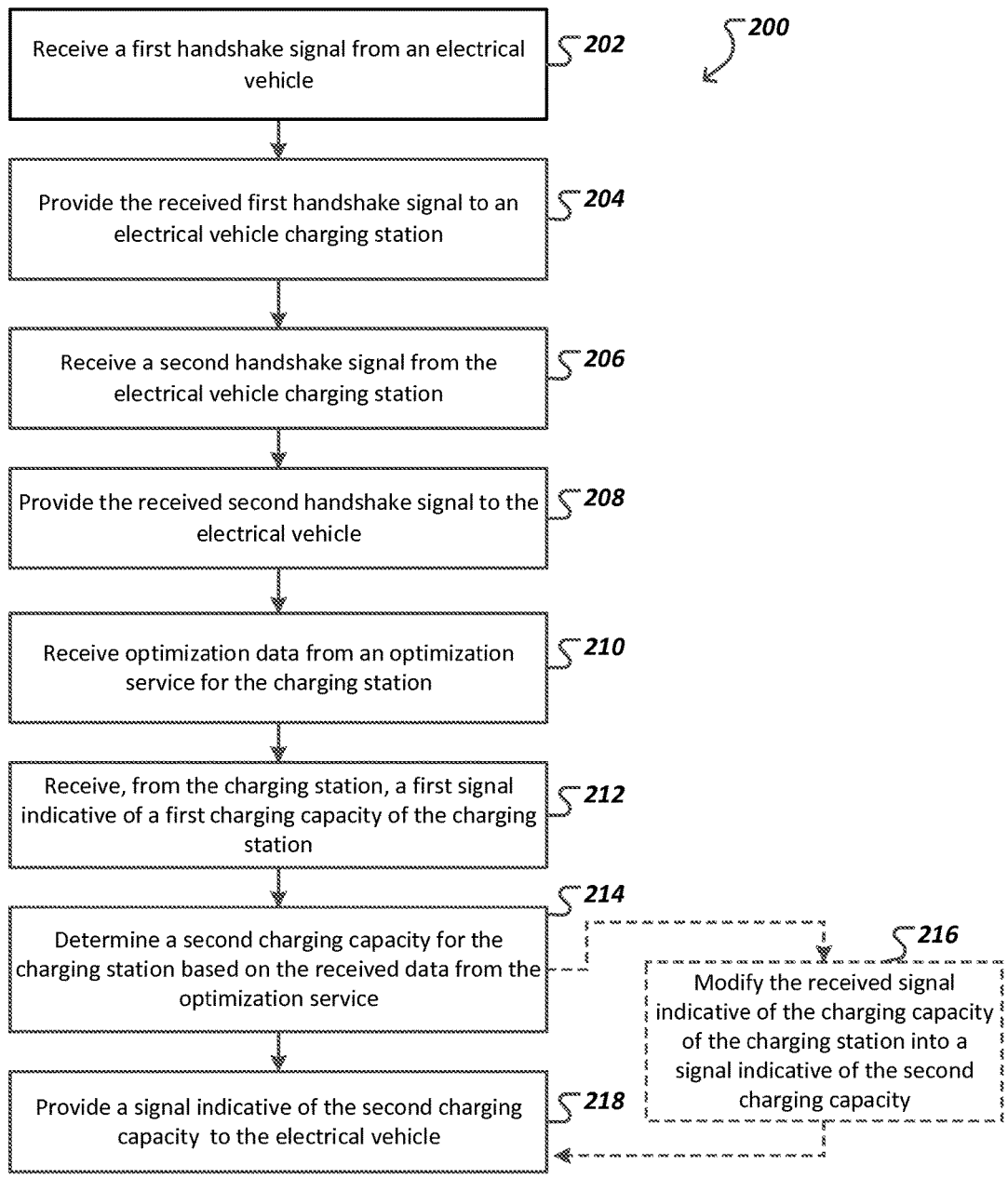
FIG. 2 is a flow diagram of an example process for controlling charging of an electrical vehicle using a mediator device for smart electrical vehicle charging.

These aspects are described below in more detail with reference to FIG. 2, which depicts a flow diagram of an example process 200 for controlling charging of an electrical vehicle using a mediator device for smart electrical vehicle charging.

The process 200 starts with receiving a first handshake signal from an electrical vehicle (202). A handshake signal may be, for example, an electrical signal that informs the charging station that an electrical vehicle is connected to the charging station and ready to receive electrical energy.

The mediator device provides the received first handshake signal to a respective electrical vehicle charging station (204). For example, the mediator device may pass through the first handshake signal to the charging station without altering the signal.

The process 200 continues with the mediator device receiving a second handshake signal from the electrical vehicle charging station (206). The second handshake signal is similar to the first handshake signal. However, the second handshake signal may be, for example, an electrical signal transmitted from the charging station to the electrical vehicle to acknowledge receipt of the first handshake signal.

The mediator device then provides the received second handshake signal to the electric vehicle (208). For example, the mediator device may pass through the second handshake signal to the charging station without altering the signal. Similar to the above, the natural component losses may affect signals passing through the mediator device, however, such small losses are not considered altering the signal.

After the handshake operations are complete, the process 200 continues with the mediator device receiving optimization data from an optimization service for the charging station (210). In some implementations, the optimization data is received wirelessly by the mediator device. The optimization data being data that allows the mediator device to optimize electrical vehicles charging operations based on the optimization data, and may specify a mediated charging capacity for the charging station.

The process 200 continues with the mediator device receiving a signal indicative of a first charging capacity of the charging station (212). In turn, the mediator device determines a second charging capacity for the charging station based on the received data from the optimization service (214). In some implementations, the mediator device modifies the revived signal indicative of the first charging capacity of the charging station into a signal indicative of the second charging capacity as shown in phantom 216.

Finally, the process 200 provides the modified signal indicative of the second charging capacity to the electrical vehicle. Thereafter, the vehicle will begin charging at a rate specified by the second charging capacity.

The process 200 may be repeated periodically, e.g., every N minutes, while the vehicle is charging. For example, the optimization service 130 may determine that the vehicle should not charge for the first two hours after being connected to the charging station, and thus will provide data specifying a mediated charging rate of 0 kW. Thereafter, the optimization service 130 may determine that the vehicle should charge at a rate of no more than 4 kW, and thus will provide data specifying a mediated charging rate of 4 kW.

In some implementations, the process 200 may be repeated periodically, e.g., every N seconds, while vehicles are charging. In some implementations, the optimization data described above may include data that specifies generation data and load data for the grid supplying a plurality of electrical vehicles. The optimization data may be used to simultaneously alter the charging rates of the plurality of electrical vehicles in order to regulate the frequency of the supplying grid. For example, at peak times when the grid is overloaded, the mediator devices may in real time lower the charging rates of the electrical vehicles charging to balance the generation against the load. Similarly, the mediator devices may increase the load at low load periods to balance the generation against the load.

The operations described above may be performed in real-time or substantially real-time. For example, the process 200 may be repeated every second, in order to balance the generation against the load to help maintain a fixed frequency at the grid and reduce frequency fluctuation.

Example Implementations

Figure 3:
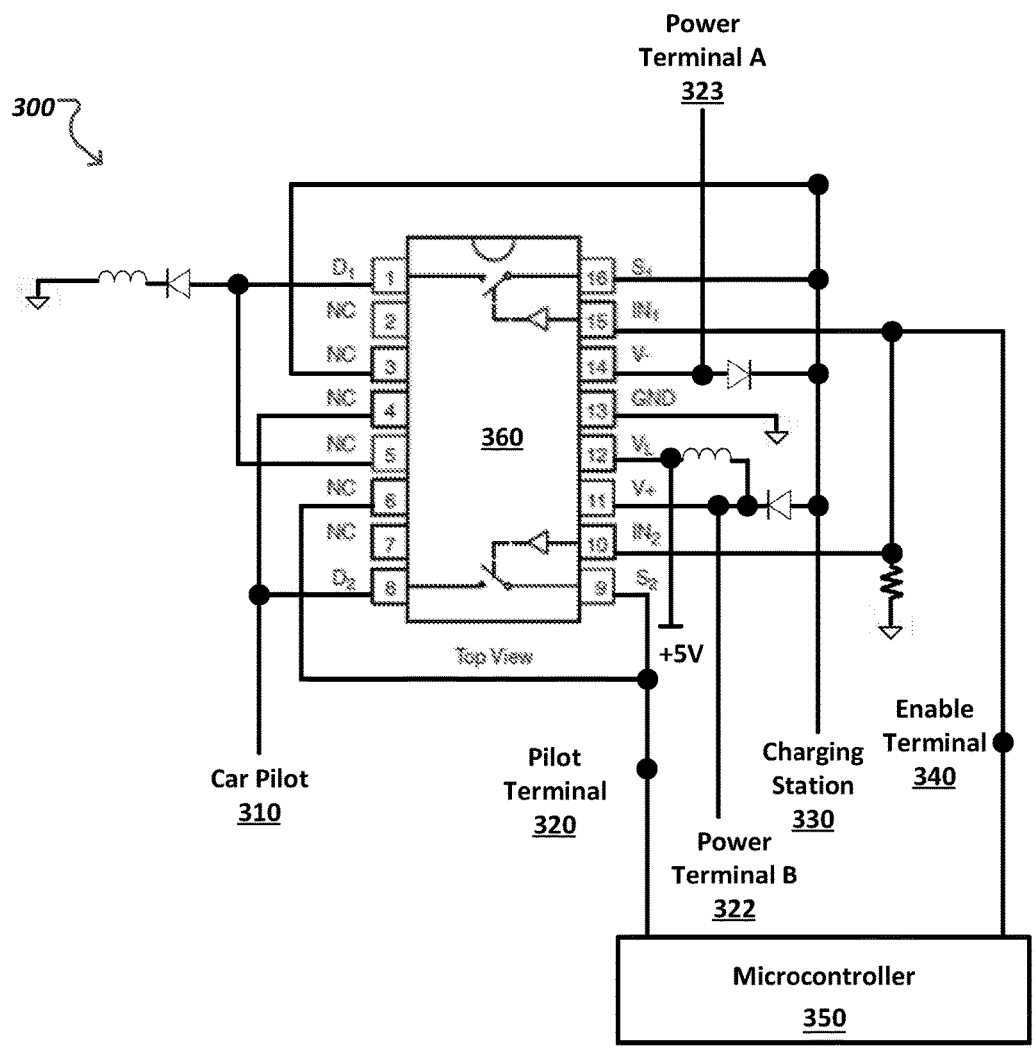
FIG. 3 is an example circuit diagram of a circuit that controls charging of an electrical vehicle.

The process described above can be implemented using, for example, a controller with a solid state switch, a relay, or other types of switches. FIG. 3 is an example circuit diagram of a circuit that controls charging of an electrical vehicle according to the process 200. The circuit 300 utilizes a solid state switch 360 to implement process 200. In one implementation, the solid state switch 360 is a Vishay DG401 switch. As described above, other types of switches may also be used.

Microcontroller 350 drives the solid state switch 360. In some implementations, the microcontroller 350 is connected to the enable terminal 340 and to the pilot terminal 320. The car pilot terminal 310 is connected to an electrical vehicle that is also connected to the charging station charging the electrical vehicle. The charging station terminal 330 is also connected to the charging station.

In one implementation, the circuit 300 selects between the charging station signal 330 and the pilot signal 320 generated by the microcontroller 350. The power terminal A 323 and power terminal B 322 are connected to a positive and a negative 15V voltage source. In this implementation, the microcontroller 350 provides a signal to the enable signal 340 to interchangeably provide either the charging station signal 330 or the pilot signal 320 to the electrical vehicle. This allows the microcontroller 350 to control the charging rate of the electrical vehicle by altering the pulse width modulation of the charging station signal 330, to change the charging rate specified by the charging station signal into a different desired charging rate. As described above, this rate can be determined based on optimization data provided from an optimization service.

In an alternative implementation, the pilot terminal is connected to ground (not shown). Additionally, power terminal A 323 and power terminal B 322 are also connected to ground. This allows the solid state switch 360 to be powered by pilot signals. In turn, pilot signals pass through microcontroller 350, even when the microcontroller is not powered.

The pilot terminal is connected to ground (not shown). This enables the microcontroller 350 to connect the pilot terminal 320 to ground based on input provided from the microcontroller 350 to the enable terminal 340. In turn, this allows the microcontroller to reduce the duty cycle of the charging by connecting the pilot terminal to ground for a portion of the duty cycle, based on the signal provided the microcontroller 350 to the enable terminal 340.

In some implementations, the signal provided to the enable terminal is a synchronized pulse width modulated signal that causes the solid state switch 360 to ground a portion of the original duty cycle. In alternative implementations, the microcontroller 350 may provide an unsynchronized signal to the enable signal to directly activate or deactivate charging station signal 330.

In some implementations, a single voltage power circuit may be driven from AC lines that are not activated until the car is connected. Pilot signals may be passed through unaltered until the car indicates it is ready to charge. Upon activation of the AC lines the microcontroller 360 will power up and become able to alter the pilot signal and, in turn, change the charging rate.

Additional Implementation Details

Although the mediator device 125 has been described as being connected to both a charging station and an electrical vehicle, the device can be integrated into the charging station, or even into the electric vehicle. For example, when integrated into the charging station, a first electrical connector of the charging station connects to the vehicle. The charging station includes the communication system that communicates with the optimization service. The charging station also includes a data processing system that receives optimization data from the optimization service and a first signal from the charging station that indicates a first charging capacity of the charging station. The data processing apparatus then provides a second signal indicative of a second charging capacity that is no more than the first capacity to the first electrical connector to the electrical vehicle. The second charging capacity is determined based on the mediated charging capacity.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal.

The operations described in this specification can be implemented as operations performed by a data processing apparatus on data stored on one or more computer-readable storage devices or received from other sources. The term "data processing apparatus" encompasses all kinds of apparatus, devices, and machines for processing data, including, by way of example, a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Devices suitable for storing computer program instructions and data include all forms of non-volatile memory, media and memory devices, including, by way of example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An apparatus, comprising:
   a first electrical connector configured to be in electrical connection with an electrical vehicle charging station;
   a second electrical connector connected to the first electrical connecter by a power bus, wherein the second electrical connector is configured to electrically connect to an electrical vehicle;
   a communication system configured to be in communication with an optimization service, wherein the optimization service provides optimization data for charging the electrical vehicle from the electrical vehicle charging station;
   a data processing system that performs operations comprising:
      receiving optimization data from the optimization service, the optimization data specifying a mediated charging capacity to be serviced by the electrical vehicle charging station based at least in part on an expected duration of a connection between the electric vehicle and the electrical vehicle charging station;
      receiving a first signal, provided to the apparatus by the electrical vehicle charging station through the first electrical connector of the apparatus, indicative of an available charging capacity of the electrical vehicle charging station;
      determining, based on the optimization data that the mediated charging capacity is less than the available charging capacity of the electrical vehicle charging station;
      modifying, based on the determination, the first signal indicative of the available charging capacity of the electrical vehicle charging station to generate a second signal indicative of the mediated charging capacity that is less than the available charging capacity of the electrical vehicle charging station; and
      providing the second signal to the electrical vehicle through the second electrical connector, wherein the second signal limits a charge rate selected by the electrical vehicle to less than or equal to the mediated charging capacity, wherein the apparatus charges the electrical vehicle through the second electrical connector at the charge rate selected by the electrical vehicle.

2. The apparatus of claim 1, wherein the data processing system performs further operations comprising:
   pass a first handshake signal from the first electrical connector to the second electrical connecter substantially unmodified; and
   pass a second handshake signal from the second electrical connector to the first electrical connecter substantially unmodified.

3. The apparatus of claim 1, wherein the first signal and the second signal conform to SAE J1772 signals.

4. The apparatus of claim 1, wherein the first signal indicative of a first available charging capacity is a pulse-width modulation signal and wherein the modification comprises modifying a pulse-width modulation signal.

5. The apparatus of claim 1, wherein the apparatus is a battery powered apparatus.

6. The apparatus of claim 1, wherein the apparatus is powered by a power signal received from the electrical vehicle.

7. The apparatus of claim 1, wherein the data processing system performs further operations comprising:
periodically receiving optimization data to determine whether to update the mediated charging capacity; and
in response to receiving an updated mediated charging capacity, modifying the second signal, indicative of the updated mediated charging capacity, to the second electrical connector to the electrical vehicle.

8. A computer-implemented method, comprising:
receiving, by an apparatus, optimization data from an optimization service for a charging station, wherein the optimization data specifies a mediated charging capacity to be serviced by the charging station based at least in part on an expected duration of a connection between an electric vehicle and the charging station;
receiving, by the apparatus over a first electrical connector that is in electrical connection with the charging station, a first signal indicative of an available charging capacity of the charging station;
determining, by the apparatus and based on the received optimization data from the optimization service, that the mediated charging capacity is less than the available charging capacity of the charging station;
modifying, by the apparatus and based on the determination, the first signal indicative of the available charging capacity of the charging station to generate a second signal indicative of the mediated charging capacity that is less than the available charging capacity of the charging station; and
providing, by the apparatus, the second signal to the electrical vehicle over a second electrical connector that is in electrical connection with the electrical vehicle, wherein the second signal limits a charge rate selected by the electrical vehicle to less than or equal to the mediated charging capacity; and
charging the electrical vehicle through the second electrical connector at the charge rate selected by the electrical vehicle.

9. The method of claim 8, wherein the apparatus comprises a first electrical connector and a second electrical connector, the method further comprising:
passing a first handshake signal from the first electrical connector to the second electrical connecter substantially unmodified; and
passing a second handshake signal from the second electrical connector to the first electrical connecter substantially unmodified.

10. The method of claim 8, wherein the first signal and the second signal conform to SAE J1772 signals.

11. The method of claim 8, wherein the first signal indicative of a first available charging capacity is a pulse-width modulation signal and wherein the modification comprises modifying a pulse-width modulation signal.

12. The method of claim 8, wherein the apparatus is a battery powered apparatus.

13. The method of claim 8, wherein the apparatus is powered by a power signal received from the electrical vehicle.

14. The method of claim 8, further comprising:
periodically receiving optimization data to determine whether to update the mediated charging capacity; and
in response to receiving an updated mediated charging capacity, modifying the second signal, indicative of the updated mediated charging capacity, to the electrical vehicle, wherein the electrical vehicle may select a charge rate up to a capacity of the updated mediated charging capacity.

* * * * *

UNITED STATES PATENT AND TRADEMARK OFFICE
CERTIFICATE OF CORRECTION

PATENT NO. : 10,377,265 B2  
APPLICATION NO. : 14/928170  
DATED : August 13, 2019  
INVENTOR(S) : Wytock et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 415 days.

Signed and Sealed this  
Nineteenth Day of May, 2020

Andrei Iancu  
*Director of the United States Patent and Trademark Office*